United States Patent
Kim et al.

(10) Patent No.: US 10,772,227 B2
(45) Date of Patent: Sep. 8, 2020

(54) DISPLAY DEVICE

(71) Applicant: LG ELECTRONICS INC., Seoul (KR)

(72) Inventors: Chanwoo Kim, Seoul (KR); Jungyul Sakong, Seoul (KR); Dongwoo Cho, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/454,696

(22) Filed: Jun. 27, 2019

(65) Prior Publication Data

US 2020/0053895 A1    Feb. 13, 2020

(30) Foreign Application Priority Data

Aug. 7, 2018   (KR) .................. 10-2018-0091934

(51) Int. Cl.
*H05K 5/03* (2006.01)
*H05K 7/20* (2006.01)
(Continued)

(52) U.S. Cl.
CPC ............. *H05K 5/03* (2013.01); *B32B 7/14* (2013.01); *B32B 27/08* (2013.01); *B32B 27/36* (2013.01);
(Continued)

(58) Field of Classification Search
CPC ............. H05K 7/20963; G06F 1/1637; Y10T 29/49817
See application file for complete search history.

(56) References Cited

U.S. PATENT DOCUMENTS 6,791,660 B1   9/2004  Hayashi et al.
7,518,298 B2 *  4/2009  Kim .................. H05K 7/20963
                                                        313/46
(Continued)

FOREIGN PATENT DOCUMENTS

CN        106873207 A     6/2017
JP        2004-148536 A   5/2004
(Continued)

*Primary Examiner* — Robert J Hoffberg
(74) *Attorney, Agent, or Firm* — Birch, Stewart, Kolasch & Birch, LLP

(57) ABSTRACT

A display device including a display panel; a module cover configured to cover a back surface of the display panel; a first adhesive member adhered to an edge of a front surface of the module cover facing the display panel and configured to adhere the module cover and the display panel; and a second adhesive member adhered to an inner area of the module cover inside the edge of the front surface and configured to adhere the module cover and the display panel. In addition, the first adhesive member includes a first base layer; and a pair of acrylic adhesive layers located at opposite sides of the first base layer and respectively adhered to the display panel and the module cover. Further, the second adhesive member includes a second base layer; a urethane adhesive layer located at one side of the second base layer and adhered to the display panel; and an acrylic adhesive layer located at the other side of the second base layer, adhered to the module cover and having a greater adhesive strength than the urethane adhesive layer.

20 Claims, 8 Drawing Sheets

(51) Int. Cl.
*B32B 27/08* (2006.01)
*G06F 1/16* (2006.01)
*B32B 7/14* (2006.01)
*B32B 27/36* (2006.01)
*B32B 27/40* (2006.01)
*H01L 27/32* (2006.01)
*H01L 51/52* (2006.01)
*H05K 5/00* (2006.01)

(52) U.S. Cl.
CPC ............ *B32B 27/40* (2013.01); *G06F 1/1637* (2013.01); *H01L 27/3272* (2013.01); *H01L 51/524* (2013.01); *H01L 51/529* (2013.01); *H05K 5/0017* (2013.01); *H05K 7/20963* (2013.01); *B32B 2307/402* (2013.01); *B32B 2457/20* (2013.01)

(56) References Cited

U.S. PATENT DOCUMENTS

| | | | | |
|---|---|---|---|---|
| 7,776,437 | B2 * | 8/2010 | Kim | C09J 7/29 428/354 |
| 7,833,600 | B2 * | 11/2010 | Harai | C09J 7/29 428/40.1 |
| 8,027,163 | B2 * | 9/2011 | Bang | H05K 7/20963 345/905 |
| 8,174,822 | B2 * | 5/2012 | Kim | H05K 3/361 345/60 |
| 9,785,185 | B2 * | 10/2017 | Rundle | G06F 1/1601 |
| 10,133,100 | B2 | 11/2018 | Song et al. | |
| 10,383,238 | B2 * | 8/2019 | Yun | H05K 5/0217 |
| 2006/0087233 | A1 | 4/2006 | Kim et al. | |
| 2009/0174317 | A1 * | 7/2009 | Jung | G02B 5/3025 313/504 |
| 2010/0014256 | A1 * | 1/2010 | Lee | H05K 5/0217 361/721 |
| 2012/0240983 | A1 | 9/2012 | Lee et al. | |
| 2014/0017466 | A1 * | 1/2014 | Won | B32B 7/06 428/214 |
| 2016/0327821 | A1 | 11/2016 | Oohira | |
| 2018/0212169 | A1 | 7/2018 | Goto | |
| 2020/0026117 | A1 * | 1/2020 | Teramoto | G09G 3/36 |

FOREIGN PATENT DOCUMENTS

| | | |
|---|---|---|
| JP | 2017-70493 A | 10/2012 |
| KR | 10-2009-0103537 A | 10/2009 |
| KR | 10-2012-0112549 A | 10/2012 |
| KR | 10-2017-0026715 A | 3/2017 |
| KR | 10/2017-0080743 A | 7/2017 |
| WO | WO-2019198922 A1 * | 10/2019 ............ H01L 51/50 |

* cited by examiner

DISPLAY DEVICE

CROSS-REFERENCE TO RELATED APPLICATIONS

Pursuant to 35 U.S.C. § 119(a), this application claims the benefit of an earlier filing date and priority to Korean Application No. 10-2018-0091934 filed on Aug. 7, 2018, which is hereby incorporated by reference in its entirety.

BACKGROUND OF THE INVENTION

1. Field of the Invention

The present invention relates to a display device, and, more particularly, to a display device including a display panel and a module cover.

2. Discussion of the Related Art

Display devices include a liquid crystal display (LCD), a field emission display (FED), a plasma display panel (PDP), an electroluminescence device, etc. As an example of an electroluminescence device, an active matrix type organic light emitting diode display device using an organic light emitting diode (OLED) is commercially available. The OLED display device is a self-luminous device and thus has no backlight. The OLED display device has advantages in response speed, viewing angle, etc. as compared to a liquid crystal device and thus is attracting attention as a next generation display.

The display device includes a display module, and the display module includes a display panel for displaying an image and a module cover covering an outer circumference and a back surface of the display panel. More specifically, the process of manufacturing the display device includes a step of mounting the display panel in the module cover by attaching the display panel to a heat dissipation plate provided inside the module cover. In order to implement a super-slim display device, the display panel is attached to the heat dissipation plate by a double-sided tape.

However, in a conventional display device, it is difficult to separate the display panel and the module cover. More specifically, the display panel and the module cover are not easily separated by the double-sided tape. Even if the display panel and the module cover are separated by force, it is difficult to cleanly remove the double-sided tape adhered to the display panel and the module cover.

SUMMARY OF THE INVENTION

An object of the present invention is to provide a display device capable of easily separating and reusing a display panel and a module cover.

Another object of the present invention is to provide a display device capable of reusing an adhesive member.

According to an aspect of the present invention, a display device includes a display panel, a module cover configured to cover a back surface of the display panel, a first adhesive member configured to adhere the module cover and the display panel, and a second adhesive member configured to adhere the module cover and the display panel, at least a portion of which has a material different from that of the first adhesive member.

The module cover may include a first area in which the first adhesive member is adhered, and a second area in which the second adhesive member is adhered, and the second area may be spaced apart from the first area.

The first area may include an edge of a front surface of the module cover, and the second area may be located inner than the first area.

The first adhesive member may include a first panel adhesive layer attached to the back surface of the display panel, a first cover adhesive layer attached to a front surface of the module cover, a first base layer located between the first panel adhesive layer and the first cover adhesive layer, a first film located between the first base layer and the first panel adhesive layer, and a second film located between the first base layer and the first cover adhesive layer.

A thickness of the first base layer may be greater than that of each of the first panel adhesive layer, the first cover adhesive layer, the first film and the second film.

The first film and the second film may have different coefficients of extension.

Any one of the first film and the second film may include thermoplastic poly urethane (TPU) and the other of the first film and the second film may include polyethyleneterephthalate (PET).

At least one of the first film or the second film may have a black layer laminated thereon.

The first base layer may include polyurethane foam.

The first panel adhesive layer and the first cover adhesive layer may include an acrylic adhesive.

The second adhesive member may include a second panel adhesive layer attached to the back surface of the display panel, a second cover adhesive layer attached to a front surface of the module cover, and a second base layer located between the second panel adhesive layer and the second cover adhesive layer.

The second base layer may include acrylic foam.

An adhesive strength of the second panel adhesive layer may be less than that of the second cover adhesive layer.

The second panel adhesive layer may include a urethane adhesive and the second cover adhesive layer includes an acrylic adhesive.

The second adhesive member may further include a third film located between the second base layer and the second panel adhesive layer.

A thickness of the second base layer may be greater than that of each of the second panel adhesive layer, the second cover adhesive layer and the third film.

The module cover may include a cover body located behind the display panel and having the first adhesive member and the second adhesive member adhered thereto, and a cover circumferential portion protruding forwardly from a circumference of the cover body to surround an outer circumference of the display panel.

The module cover may include a heat dissipation plate located behind the display panel and having the first adhesive member and the second adhesive member adhered thereto, a cover body located behind the heat dissipation plate, and a cover circumferential portion protruding forwardly from a circumference of the cover body to surround an outer circumference of the display panel and the heat dissipation plate.

According to another aspect of the present invention, a display device includes a display panel, a module cover configured to cover a back surface of the display panel, a first adhesive member configured to adhere the display panel and an edge of the module cover, a second adhesive member configured to adhere the display panel and the module cover and located inner than the first adhesive member. The first adhesive member includes a first base layer and a pair of acrylic adhesive layers located at opposite sides of the first base layer and respectively adhered to the display panel and the module cover. The second adhesive member includes a second base layer, a urethane adhesive layer located at one side of the second base layer and adhered to the display panel, and an acrylic adhesive layer located at the other side of the second base layer, adhered to the module cover and having a greater adhesive strength than the urethane adhesive layer.

A distance between a right end of the second adhesive member and a right edge of the module cover may be equal or similar to a distance between a left end of the second adhesive member and a left edge of the module cover.

BRIEF DESCRIPTION OF THE DRAWINGS

The present invention will become more fully understood from the detailed description given below and the accompanying drawings, which are given by illustration only, and thus are not limitative of the present invention, and wherein.

DETAILED DESCRIPTION OF THE PREFERRED EMBODIMENTS

Figure 1:
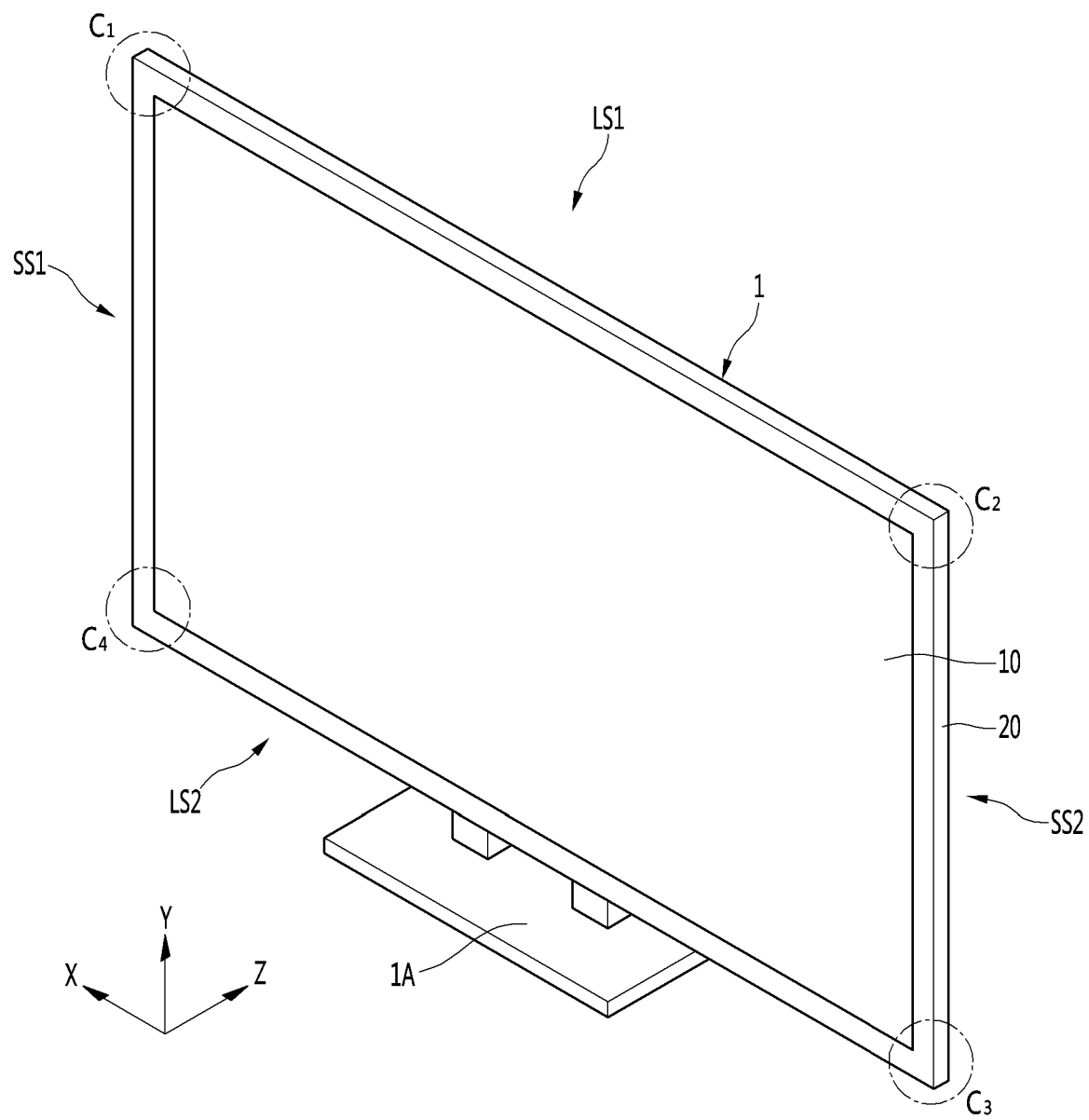
FIG. 1 is a perspective view showing a display device according to an embodiment of the present invention.
Figure 2:
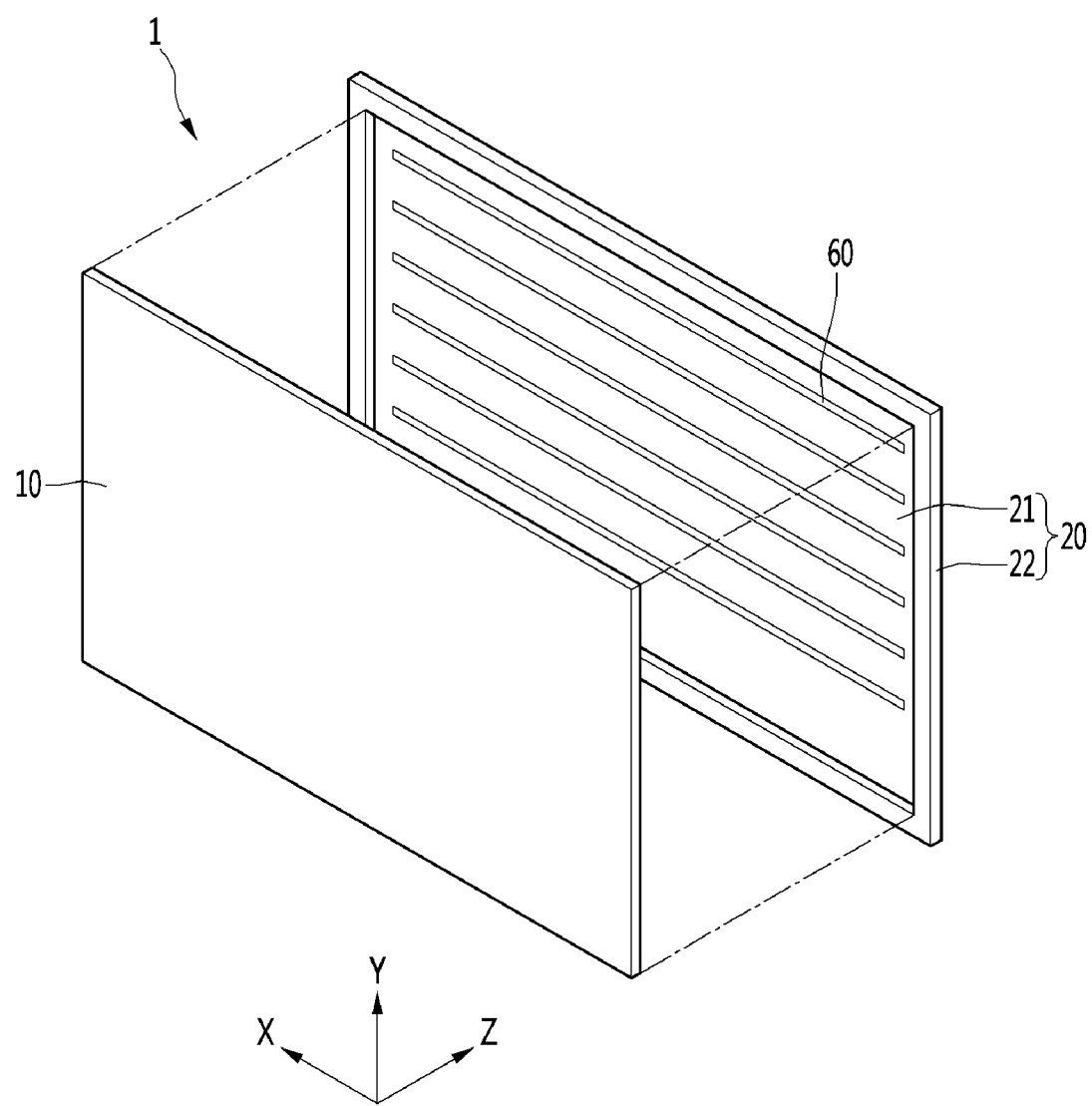
FIG. 2 is an exploded perspective view showing an example of a display module.
Figure 3:
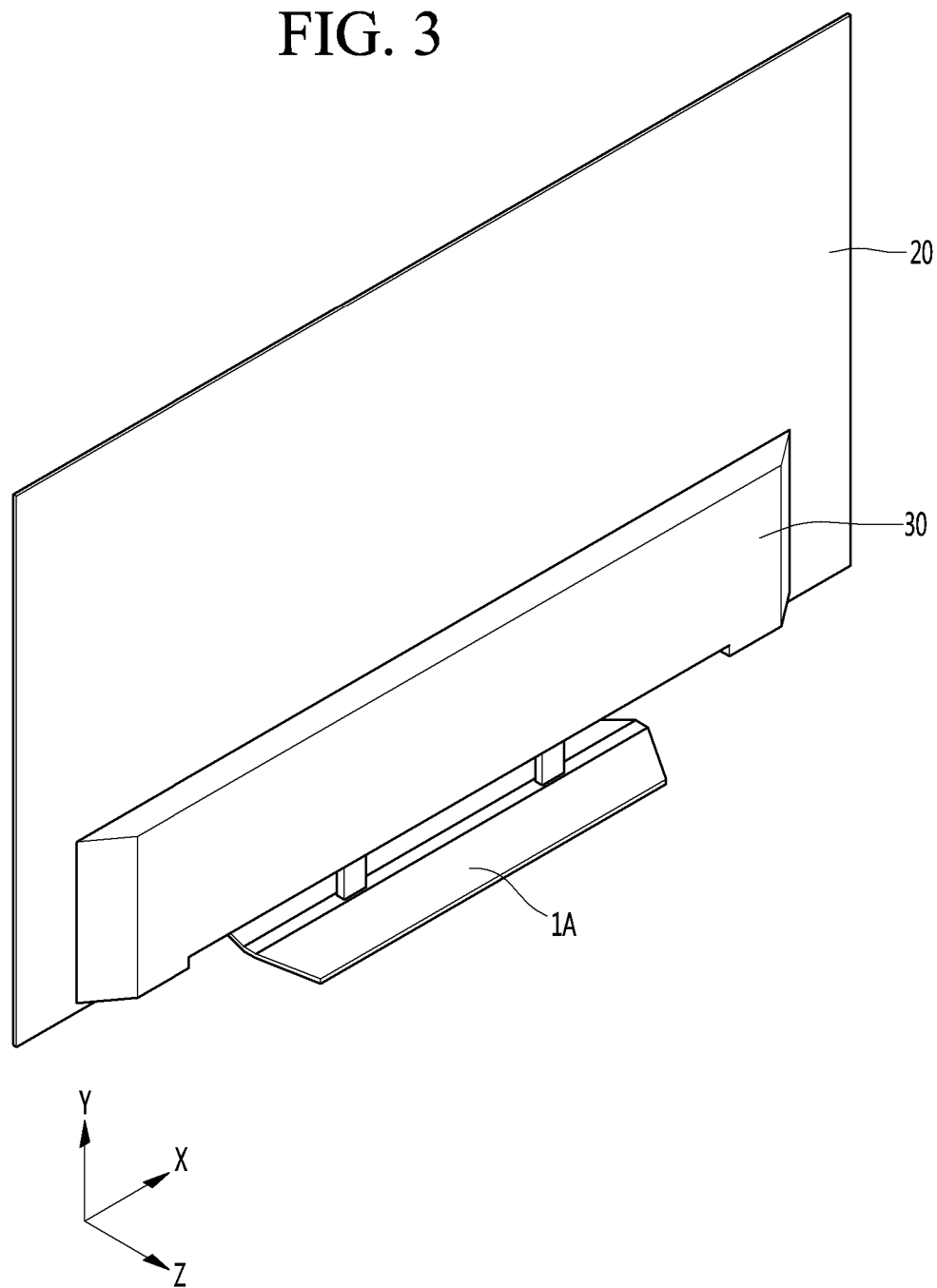
FIG. 3 is a perspective view of a display device according to an embodiment of the present invention when viewed in a direction different from that of FIG. 1.

Hereinafter, exemplary embodiments of the present invention will be described in detail with reference to the drawings. FIG. 1 is a perspective view showing a display device according to an embodiment of the present invention, FIG. 2 is an exploded perspective view showing an example of a display module, and FIG. 3 is a perspective view of a display device according to an embodiment of the present invention when viewed in a direction different from that of FIG. 1.

The display device according to the embodiment of the present invention may include a display module 1, a stand 1A supporting the display module 1 at the lower side thereof, and a back cover 30 located behind the display module 1.

The display module 1 may have a substantially rectangular plate shape. More specifically, the display module 1 may include a first long side LS1, a second long side LS2 opposed to the first long side LS1, a first short side SS1 adjacent to one end of the first long side LS1 and the second long side LS2, and a second short side SS2 opposed to the first short side SS1. The first long side LS1, the second long side LS2, the first short side SS1 and the second short side SS2 may mean the upper side, the lower side, the left side and the right side of the display module 1, respectively.

The length of the first and second long sides LS1 and LS2 may be greater than that of the first short sides SS1 and SS2, without being limited thereto, and the length of the first and second long sides LS1 and LS2 may be substantially equal to that of the first short sides SS1 and SS2.

In addition, points where the first long side LS1, the second long side LS2, the first short side SS1 and the second short side SS2 meet with each other may be referred to as corners. For example, a point where the first long side LS1 and the first short side SS1 meet may be referred to as a first corner C1, a point where the first ling side LS1 and the second short side SS2 meet may be referred to as a second corner C2, a point where the second short side SS2 and the second long side LS2 meet may be referred to as a third corner C3, and a point where the second long side LS2 and the first short side SS1 meet may be referred to as a corner C4.

The display module 1 may be supported by the stand 1A. The stand 1A may support the display module 1 at the lower end of the display module 1. The display module 1 may include a display panel 10 for displaying an image and a module cover 20 covering the display panel 10 at the back side thereof. The display panel 10 may be an OLED panel. The display panel 10 may display an image at a front side thereof.

The module cover 20 may be a rectangular frame. The module cover 20 may be made of a high-strength steel plate such as electro galvanized iron (EGI), stainless steel (SUS), galvarium (SGLC), aluminum coated steel plate (AL-COSTA), tin plated steel plate (SPTE), etc. In addition, the module cover 20 may be made of an advanced composite material (ACM) which is a combination of carbon fiber, silicon carbide fiber, aramid fiber or boron fiber and heat resistant resin such as epoxy resin or polyimide.

When the module cover 20 is made of ACM, a conductive tape may be attached to the inner surface of the module cover 20. The conductive tape can improve coupling of the display panel 10 and reduce electromagnetic interference (EMI), thereby reducing noise mixed in an input image.

The module cover 20 may include a cover body 21 located behind the display panel 10 and a cover circumferential portion 22 protruding forwardly from the circumference of the cover body 21 to surround the outer circumference of the display panel 10. The cover body 21 may cover the back surface of the display panel 10, and the area of the cover body 21 may correspond to that of the display panel 10.

The cover circumferential portion 22 may be provided along the four sides of the display panel 10 to surround the edge of the outer circumference of the display panel 10. The cover circumferential portion 22 and the outer circumference of the display panel 10 may be spaced apart from each other to form a predetermined gap. The gap is very small, thereby minimizing penetration of external foreign materials through the gap.

An electric portion covered by a back cover 30 may be provided on the back surface of the module cover 20. More specifically, the electric portion may be provided on the back surface of the cover body 21. The electric portion may include an electric part such as a system board (SB) and a power supply (PS).

The back cover 30 is disposed behind the module cover 20 to cover the electric portion at the back side thereof. The size of the back cover 30 may be less than that of the module cover 20.

In addition, the display module 1 according to the present embodiment may further include an adhesive member 60 for adhering the module cover 20 to the display panel 10. The adhesive member 60 may be located between the back surface of the display panel 10 and the front surface of the module cover 20.

More specifically, the adhesive member 60 may be located between the display panel 10 and the cover body 21 to adhere the display panel 10 to the cover body 21. A plurality of adhesive members 60 is preferably provided, but only one adhesive member may be provided. The number, size and shape of adhesive members 60 can be changed as necessary.

The adhesive member 60 may be attached to the front surface of the cover body 21 and the back surface of the display panel 10. Therefore, the back surface of the display panel 10 and the front surface of the cover body 21 can be attached to each other.

Figure 4:
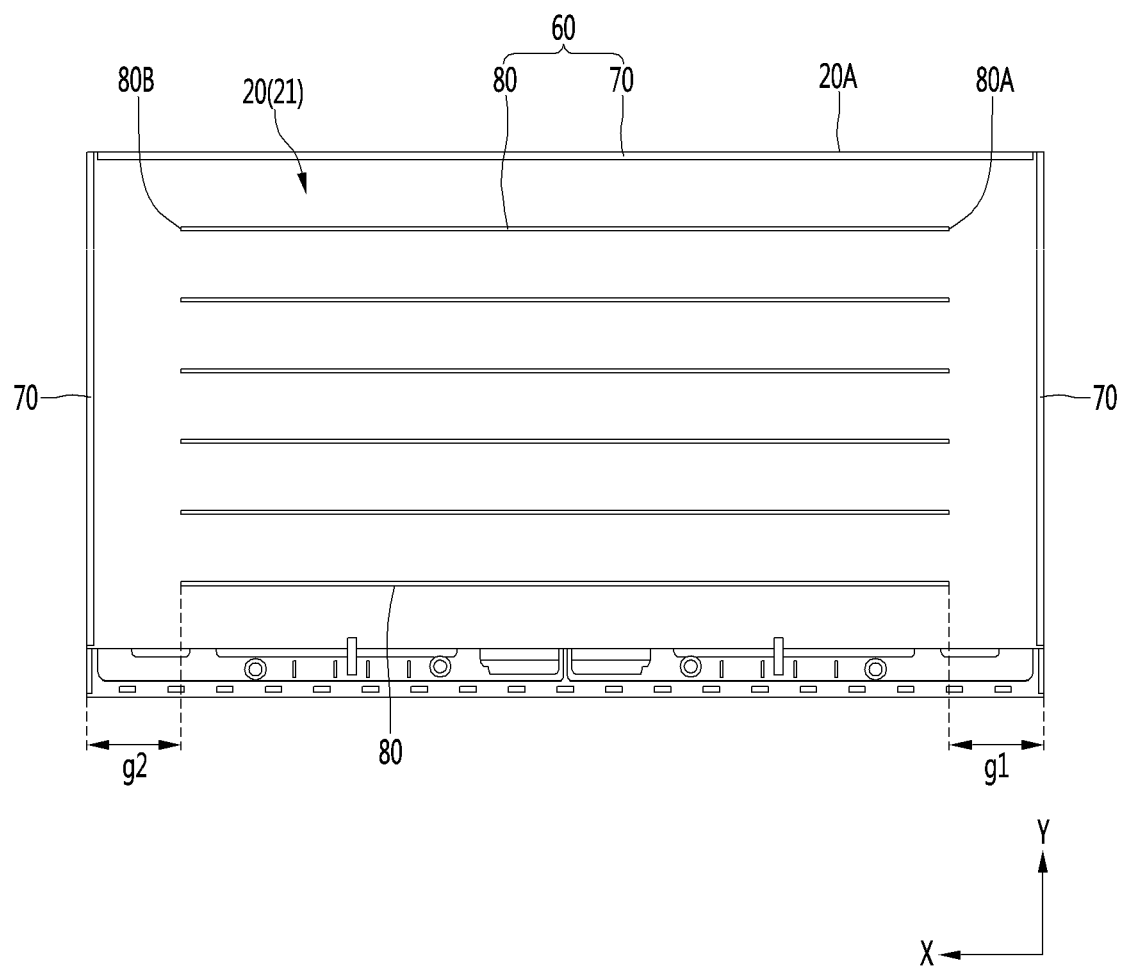
FIG. 4 is a front view of a display module, from which a display panel is removed.
Figure 5:
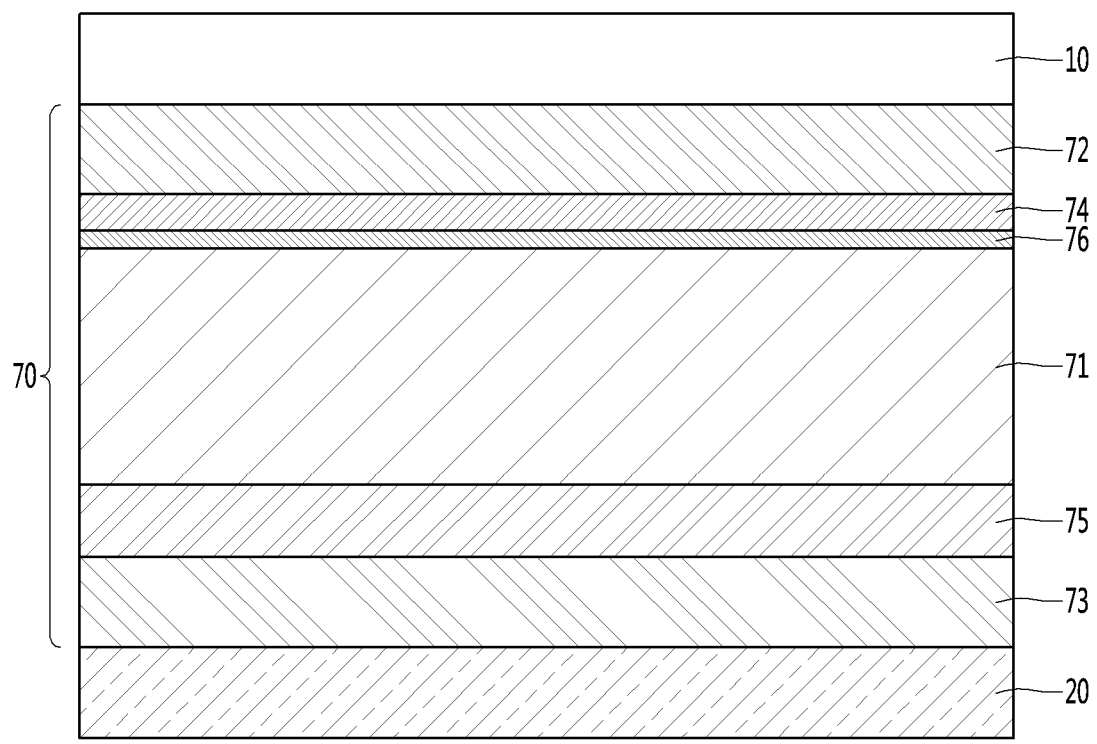
FIG. 5 is a view showing the configuration of a first adhesive member according to an embodiment of the present invention.
Figure 6:
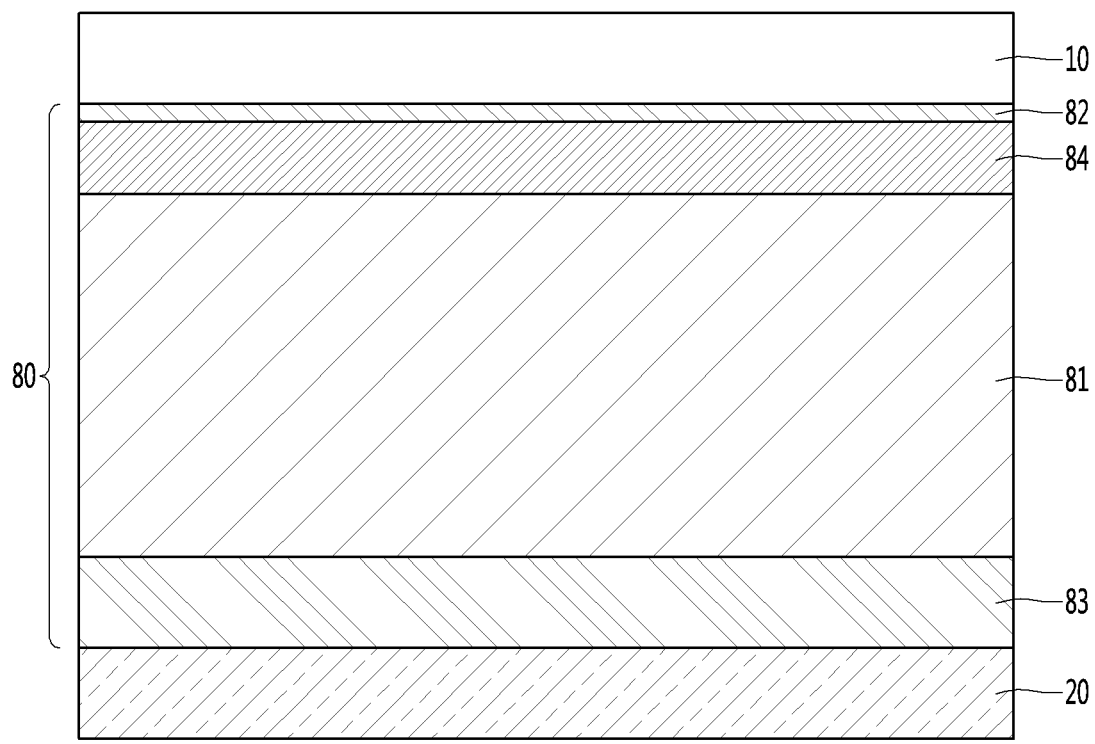
FIG. 6 is a view showing the configuration of a second adhesive member according to an embodiment of the present invention.

Next, FIG. 4 is a front view of a display module, from which a display panel is removed, FIG. 5 is a view showing the configuration of a first adhesive member according to an embodiment of the present invention, and FIG. 6 is a view showing the configuration of a second adhesive member according to an embodiment of the present invention.

In the process of assembling the display module 1, the adhesive member 60 may be adhered to the front surface of the module cover 20. Thereafter, the display panel 10 may be adhered to the module cover 20 by disposing the back surface of the display panel 10 to be close to the adhesive member 60.

Each adhesive member 60 may be made of a double-sided adhesive tape and have a smaller thickness than the display panel 10 and the module cover 20, thereby reducing the thickness of the display module 1. For example, the thickness of the adhesive member 60 may be 0.2 mm to 0.4 mm. Preferably, the thickness of the adhesive member 60 may be about 0.3 mm.

The plurality of adhesive members 60 may include a first adhesive member 70 and a second adhesive member 80, at least a portion of which has a material different from that of the first adhesive member 70. The detailed configuration of the first and second adhesive members 70 and 80 will now be described in detail.

The first adhesive member 70 and the second adhesive member 80 do not overlap each other and adhere different areas of the display panel 10 and the module cover 20 to each other. That is, the module cover 20 may include a first area in which the first adhesive member 70 is adhered and a second area in which the second adhesive member 80 is adhered. The second area is different from the first area.

In addition, the first adhesive member 70 may be adhered to at least a portion of the first area and the second adhesive member 80 may be adhered to at least a portion of the second area. The first area may include a front edge 20A of the module cover 20. The front edge 20A of the module cover 20 may mean the front edge of the cover body 21. The front edge may include an outermost edge of the front surface of the cover body 21 and a portion of the front surface adjacent thereto. That is, the first adhesive member 70 may adhere the edge of the module cover 20, more specifically, the cover body 21, and the edge of the display panel 10 to each other.

The second area may be located inside the first area. That is, the first adhesive member 70 may be adjacent to the edge 20A of the module cover 20, and the second adhesive member 80 may be adhered to a place far from the edge 20A of the module cover 20. Accordingly, the first adhesive member 70 may be an outer adhesive member and the second adhesive member 80 may be referred to as an inner adhesive member.

The plurality of first adhesive members 70 and the plurality of second adhesive members 80 are provided, without being limited thereto. For example, the plurality of first adhesive members 70 may be adhered to the upper, left and right edges of the front surface of the module cover 20. In addition, the second adhesive member 80 may extend in one direction. In this instance, an end 80A of the second adhesive member 80 may be spaced apart from the edge of the module cover 20 by a certain gap g in the above-described direction.

For example, the second adhesive members 80 may extend in a left-and-right direction and the end 80A of the second adhesive member 80 may be spaced apart from the first adhesive member 70 by a certain gap in the left-and-right direction. In addition, the plurality of second adhesive members 80 may be attached to be spaced part from each other at a certain gap in one direction. In this instance, the length of the second adhesive member 80 may be equal to or greater than half the width of the module cover 20 and the display panel 10. Therefore, it is possible to sufficiently ensure adhesive strength between the display panel 10 and the module cover 20.

In addition, both ends 80A of the second adhesive member 80 may be spaced apart from the left and right edges of the module cover 20 by the same or similar gap. More specifically, the gap g1 between the right end 80A of the second adhesive member 80 and the right edge of the module cover 20 may be equal or similar to the gap g2 between the left end 80B of the second adhesive member 80 and the left edge of the module cover 20.

Therefore, the adhesive strength between the display panel 10 and the module cover 20 may be uniform. In addition, when the display panel 10 and the module cover 20 are separated, it is possible to perform a separation process by performing a suction process with respect to any one of the left and right edges of the display panel 10 using a suction jig. This will be described below in detail.

Hereinafter, the configuration of the first adhesive member 70 will be described with reference to FIG. 5. The first adhesive member 70 may include a first base layer 71, a first panel adhesive layer 72, a first cover adhesive layer 73, a first film 74 and a second film 75.

The first base layer 71 may be a foamed layer. The expansion ratio of the first base layer 71 may be sufficiently high, such that the first base layer 71 has rigidity enough to be easily cut by a film such as a chip on film (COF). More specifically, the first base layer 71 may include any one of polyurethane foam, acrylic foam or a silicone foam. Preferably, the first base layer 71 may include polyurethane (Pu) foam.

Further, the thickness of the first base layer 71 may be 0.4 to 0.6 times that of the first adhesive member 70. For example, if the thickness of the first adhesive member 70 is about 0.3 mm, the thickness of the first base layer 71 may be about 0.13 mm. In addition, the thickness of the first base layer 71 may be greater than that of each of the first panel adhesive layer 72, the first cover adhesive layer 73, the first film 74 and the second film 75. That is, the first base layer 71 may have the largest thickness among the components of the first adhesive member 70. Therefore, a cutting member (e.g., COF) for cutting the first adhesive member 70 can easily cut the first base layer 71.

The first panel adhesive layer 72 may be adhered to the back surface of the display panel 10, and the first cover adhesive layer 73 may be front surface of the module cover 20, more specifically, the cover body 21. Also, the first panel adhesive layer 72 may be formed on one surface of the first film 74, and the first cover adhesive layer 73 may be formed on one surface of the second film 75.

Further, the first panel adhesive layer 72 and the first cover adhesive layer 73 may be located at opposite sides of the first base layer 71. That is, the first base layer 71 may be located between the first panel adhesive layer 72 and the first cover adhesive layer 73. The first panel adhesive layer 72 and the first cover adhesive layer 73 may also be acrylic adhesive layers.

That is, the first panel adhesive layer 72 and the first cover adhesive layer 73 may include acrylic adhesive. Since acrylic adhesive is superior to silicone adhesive and urethane adhesive in terms of adhesive strength, the adhesive strength of the first adhesive member 70 can be higher than that of the second adhesive member 80 including urethane adhesive. This will be described below in detail.

For example, the first panel adhesive layer 72 and the first cover adhesive layer 73 may be formed of adhesive composition including at least one of (meth)acrylic monomer, oligomer, resin and a combination thereof and the adhesive composition may further include a heat initiator, a photoinitiator, a thermosetting agent, a photo-curing agent, a cross-linking agent, a plastizier, etc. In addition, the first panel adhesive layer 72 and the first cover adhesive layer 73 may be formed by performing light irradiation and/or heat treatment with respect to the adhesive composition. Photo-curing reaction may proceed by light irradiation and heat curing reaction proceed by heat treatment.

Further, the thicknesses of the first panel adhesive layer 72 and the first cover adhesive layer 73 may be 0.1 to 0.2 times that of the first adhesive member 70. For example, when the thickness of the first adhesive member 70 is about 0.3 mm, the thickness of each of the first panel adhesive layer 72 and the first cover adhesive layer 73 may be about 0.05 mm.

Also, the first film 74 may be located between the first base layer 71 and the first panel adhesive layer 72, and the second film 75 may be located between the first base layer 71 and the first cover adhesive layer 73. The first film 74 may be adhered to one surface of the base layer 71, and the second film 75 may be adhered to the other surface of the base layer 71.

The first film 74 and the second film 75 may include at least one of polyethylene, polypropylene, polyurethane, polyethyleneterephthalate, polybutyleneterephthalate, polyurea, polyvinylchloride, polyvinylacetate, ethylenevinylacetate, polyphenylenesulfide, polyamide, polyimide, polybenzimidazole, polyetheretherketone and a combination thereof.

Preferably, the first film 74 may include thermoplastic poly urethane (TPU), and the second film 75 may include polyethyleneterephthalate (PET). The coefficients of extension of the first film 74 and the second film 75 may be different from each other. If the coefficients of extension of the first film 74 and the second film 75 are the same and the first adhesive member 70 is manufactured and carried in a roll type, wrinkles may occur in any one of the first film 74 or the second film 75. Accordingly, this can be solved by making the coefficients of extension of the first film 74 and the second film 75 different.

In addition, a black layer may be laminated on at least one of the first film 74 or the second film 75. For example, a black layer can be laminated on one or both layers of the second film 75. The black layer may be formed by applying and drying black composition including a black coloring agent on at least one surface of the second film 75. By the black layer, the first adhesive member 70 can prevent light emitted to the back side of the display panel 10 from leaking between the display panel 10 and the module cover 20.

The first film 74 and the second film 75 may have thicknesses enough to provide sufficient dimensional stability without excessively increasing the total thickness of the first adhesive member 70. More specifically, the thickness of the first film 74 may be 0.05 to 0.08 times that of the first adhesive member 70. For example, if the thickness of the first adhesive member 70 is about 0.3 mm, the thickness of the first film 74 may be about 0.02 mm.

In addition, the thickness of the second film 75 may be 0.1 to 0.2 times that of the first adhesive member 70. For example, if the thickness of the first adhesive member 70 is about 0.3 mm, the thickness of the second film 75 may be about 0.05 mm. Since the first film 74 does not include the black layer and the second film 75 includes the black layer, the thickness of the second film 75 may be greater than that of the first film 74.

The interfacial adhesive strength between the first film 74 and the first panel adhesive layer 72 may be greater than the adhesive strength between the first panel adhesive layer 72 and the back surface of the display panel 10. The interfacial adhesive strength between the second film 75 and the first cover adhesive layer 73 may be greater than the adhesive strength between the first cover adhesive layer 73 and the front surface of the module cover 20.

After the display panel 10 and the module cover 20 are separated from each other, the first panel adhesive layer 72 may be easily and cleanly removed from the display panel 10 by the first film 74. In addition, the first cover adhesive layer 73 may be easily and cleanly removed from the module cover 20 by the second film 75.

Further, the first adhesive member 70 may further include an auxiliary adhesive layer 76 located between the first base layer 71 and the first film 74. The auxiliary adhesive layer 76 may be an acrylic adhesive layer. That is, the auxiliary adhesive layer 76 may include an acrylic adhesive layer. The auxiliary adhesive layer 76 may attach the first film 74 to one surface of the first base layer 71. The auxiliary adhesive layer 76 may be omitted as necessary.

Hereinafter, the configuration of the second adhesive member 80 will be described with reference to FIG. 6. The second adhesive member 80 may include a second base layer 81, a second panel adhesive layer 82 and a second cover adhesive layer 83.

The second base layer 81 may be a foamed layer. More specifically, the second base layer 81 may include any one of polyurethane foam, acrylic foam or a silicone foam. Preferably, the second base layer 81 may include acrylic foam. The thickness of the second base layer 81 may be 0.5 to 0.8 times that of the second adhesive member 80. For example, if the thickness of the second adhesive member 80 is about 0.3 mm, the thickness of the second base layer 81 may be about 0.2 mm.

In addition, the thickness of the second base layer 81 may be greater than that of each of the second panel adhesive layer 82, the second cover adhesive layer 83 and a third film 84. That is, the second base layer 81 may have the largest thickness among the elements of the second adhesive member 80. Therefore, the second adhesive member 80 may have the substantially same thickness as the first adhesive member 70. Therefore, it is possible to prevent assembling failure that the display panel 10 is adhered only to the first adhesive member 70 and is not adhered to the second adhesive member 80.

The second panel adhesive layer 82 may be adhered to the back surface of the display panel 10, and the second cover adhesive layer 83 may be adhered to the front surface of the module cover 20, more specifically, the cover body 21. The second panel adhesive layer 82 may be formed on one surface of the third film 84. The second cover adhesive layer 83 may be formed on one surface of the second base layer 81.

The second panel adhesive layer 82 and the second cover adhesive layer 83 may be located at opposite sides of the second base layer 81. That is, the second base layer 81 may be located between the second panel adhesive layer 82 and the second cover adhesive layer 83.

In addition, the second panel adhesive layer 82 may be a urethane adhesive layer. That is, the second panel adhesive layer 82 may include a urethane adhesive. The urethane adhesive has less adhesive strength than silicone adhesive, and may be cleanly separated from an object to be adhered. In addition, the urethane adhesive may be reused because the adhesive strength is maintained even when the urethane adhesive is separated from the object to be adhered. That is, when a damaged or broken display panel 10 is separated from the module cover 20 and another display panel 10 is installed in the module cover 20, the second adhesive member 80 may be reused.

In contrast, the second cover adhesive layer 83 may be an acrylic adhesive layer. That is, the second cover adhesive layer 83 may include an acrylic adhesive. Since the acrylic adhesive has greater adhesive strength than the urethane adhesive, adhesive strength between the second cover adhesive layer 83 and the module cover 20 is greater than the adhesive strength between the second panel adhesive layer 82 and the display panel 10. Accordingly, when an external force is applied to the display panel 10 to peel the second adhesive member 80, the second cover adhesive layer 83 is not peeled off from the module cover 20 and the second panel adhesive layer 82 is peeled off from the display panel 10.

Further, the thickness of the second panel adhesive layer 82 may be 0.03 to 0.05 times that of the second adhesive member 80. For example, if the thickness of the second adhesive member 80 is about 0.3 mm, the thickness of the second panel adhesive layer 82 may be about 0.012 mm. The thickness of the second cover adhesive layer 83 may be 0.1 to 0.2 times that of the second adhesive member 80. For example, if the thickness of the second adhesive member 80 is about 0.3 mm, the thickness of the second cover adhesive layer 83 may be about 0.05 mm.

In addition, the second adhesive member 80 may further include the third film 84 located between the second base layer 81 and the second panel adhesive layer 82. One surface of the third film 84 is adhered to the second base layer 81 and the urethane adhesive is applied onto the other surface of the third film 84, thereby forming the second panel adhesive layer 82.

The third film 84 may include at least one of polyethylene, polypropylene, polyurethane, polyethyleneterephthalate, polybutyleneterephthalate, polyurea, polyvinylchloride, polyvinylacetate, ethylenevinylacetate, polyphenylenesulfide, polyamide, polyimide, polybenzimidazole, polyetheretherketone and a combination thereof. Preferably, the third film 84 may include polyethyleneterephthalate (PET).

The thickness of the third film 84 may be 0.05 to 0.2 times that of the second adhesive member 80. For example, if the thickness of the second adhesive member 80 is about 0.3 mm, the thickness of the third film 84 may be about 0.038 mm.

Figure 7:
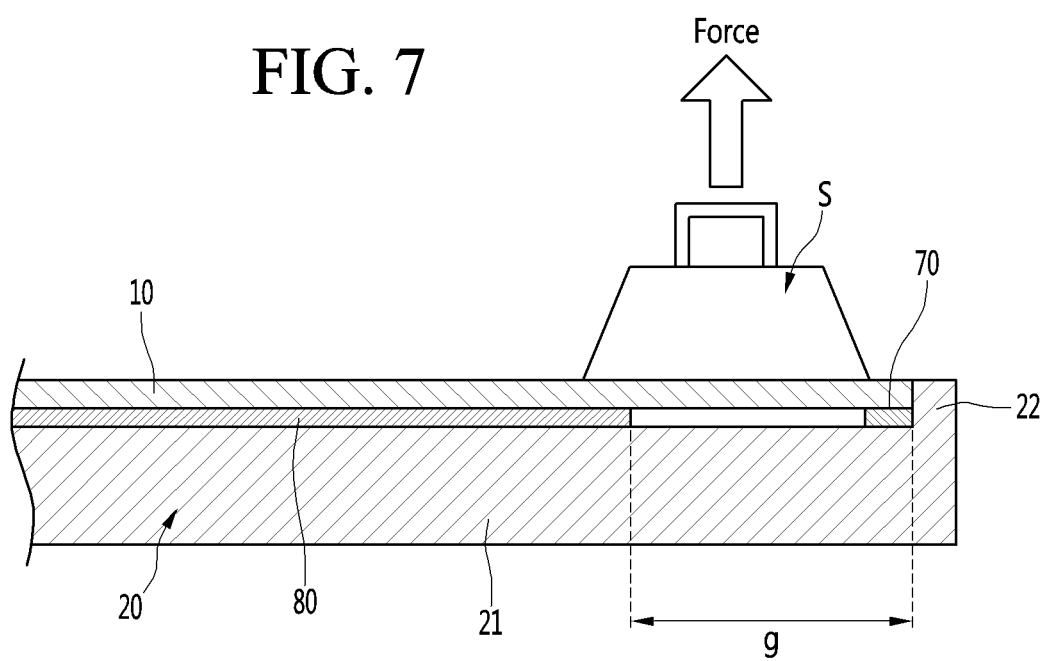
FIG. 7 is a view illustrating a process of separating a display panel and a module cover.

Next, FIG. 7 is a view illustrating a process of separating a display panel and a module cover. In more detail, the display device may be detached if repair or maintenance is required. In this instance, an operator can separate the module cover and the display panel.

First, the operator can cut at least a portion of the first adhesive member 70 using a separate cutting member or the COF provided in the display panel 10. More specifically, the operator can pull the display panel 10 using the suction mechanism S, widen a gap between the display panel 10 and the module cover 20, and cut at least a portion of the first adhesive member 70 through the gap.

Since the first adhesive member 70 is located at the edges of the display panel 10 and the module cover 20, the operator can easily cut the first adhesive member 70. In this instance, as described above, the first base layer 71 of the first adhesive member 70 may be cut.

Since the second adhesive member 80 is located inside the first adhesive member 70 and has a very small thickness (e.g., 0.3 mm), it is more difficult to cut the second adhesive member 80 using the same physical cutting method as the first adhesive member. Accordingly, after at least a portion of the first adhesive member 70 is cut, the operator can pull the display panel 10 using the suction mechanism S, thereby peeling the second adhesive member 80. In this instance, the portion of the display panel 10 sucked by the suction mechanism S may at least partially overlap a portion between the first adhesive member 70 and the second adhesive member 80.

When the operator pulls the suction mechanism S, peeling may occur from the end of the second adhesive member 80. As described above, the second panel adhesive layer 82 of the second adhesive member 80 may include a urethane adhesive and may be cleanly peeled off from the display panel 10.

In addition, when the operator pulls the suction mechanism S, the second adhesive member 80 is peeled and, at the same time, the first adhesive member 70 which is not cut yet can be cut. When the first adhesive member 70 is completely cut and the second adhesive member 80 is completely peeled, the display panel 10 and the module cover 20 can be separated. In this instance, a portion of the first adhesive member 70 is adhered to the display panel 10 and another portion of the first adhesive member 70 and the second adhesive member 80 are adhered to the module cover 20.

More specifically, the portion of the first adhesive member 70 adhered to the display panel 10 may include a portion of the first base layer 71, the first panel adhesive layer 72, and the first film 74. The other portion of the first adhesive member 70 adhered to the module cover 20 may include the other portion of the first base layer 71, the first cover adhesive layer 73, and the second film 75.

The operator can peel a portion of the first adhesive member 70 adhered to the display panel 10 off from the display panel 10. As described above, the first panel adhesive layer 72 may be cleanly peeled off from the display panel 10 by the first film 74. In addition, the operator can peel the other portion of the first adhesive member 70 adhered to the module cover 20 off from the module cover 20. As described above, the first cover adhesive layer 73 may be cleanly peeled off from the module cover 20 by the second film 75.

Therefore, the first adhesive member 70 can be cleanly peeled off from the display panel 10 and the module cover 20 separated from each other. Accordingly, at least one of the display panel 10 and the module cover 20 separated from each other can be reused.

Further, the entire second adhesive member 80 may be adhered to the module cover 20, from which the display panel 10 is separated. In this instance, as described above, since the adhesive strength of the second panel adhesive layer 82 can be maintained, the second adhesive member 80 can be reused. Therefore, the cost of the second adhesive member 80 is reduced.

For example, when the display panel 10 of the display device is damaged or broken, the operator can separate an abnormal display panel 10 from the module cover 20 and peel a portion of the first base layer 71, the second film 75 and the first cover adhesive layer 73 adhered to the module cover 20. The operator can maintain the second adhesive member 80 adhered to the module cover 20.

Thereafter, the operator can adhere a new first adhesive member 70 to the module cover 20 and couple a normal display panel 10 to the module cover 20. That is, the normal display panel 10 can be coupled to the module cover 20 by the new first adhesive member 70 and the already used second adhesive member 80.

Figure 8:
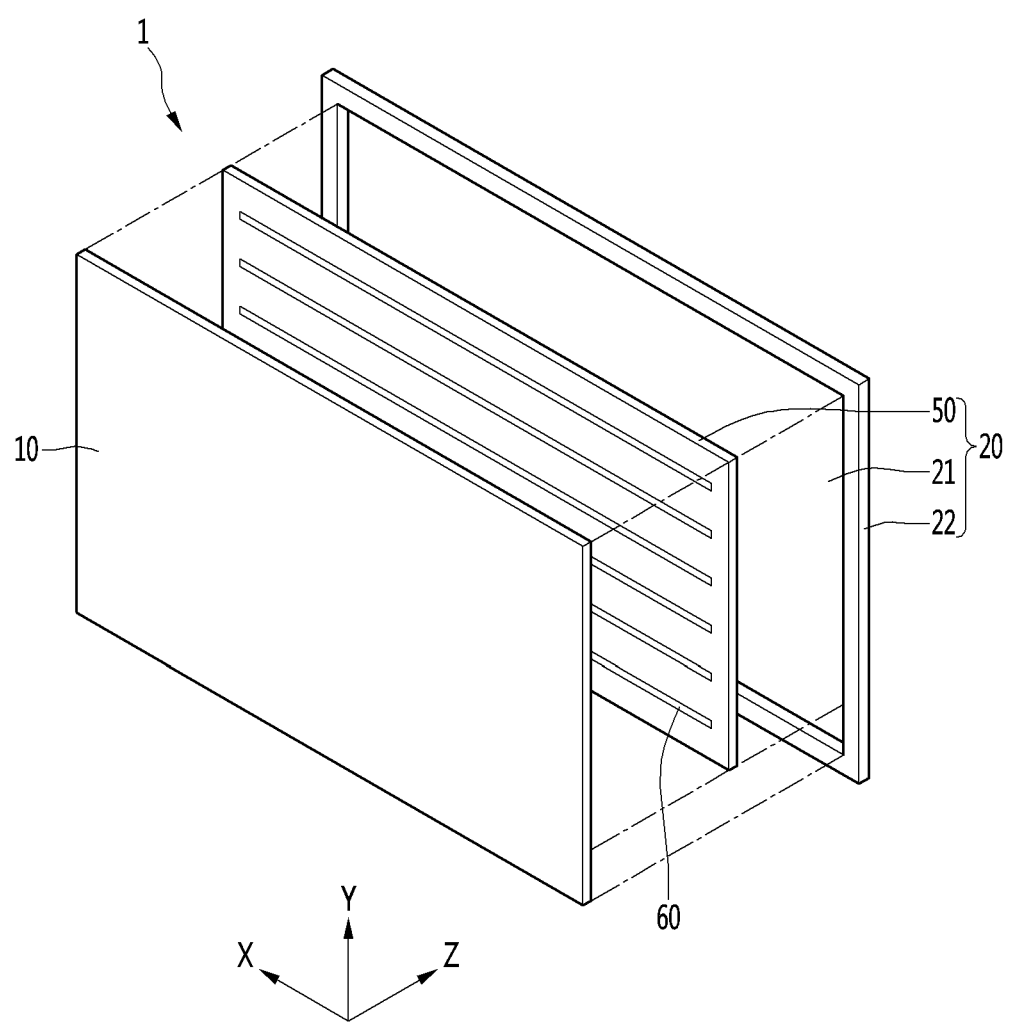
FIG. 8 is an exploded perspective view showing another example of a display module.

Next, FIG. 8 is an exploded perspective view showing another example of a display module. Hereinafter, a repeated description will be omitted and a difference will be focused upon. The module cover 20 according to the present embodiment may further include a heat dissipation plate 50. The heat dissipation plate 50 may be disposed between the cover body 21 and the display panel 10 in a forward-and-backward direction.

The cover body 21 may cover the back surface of the heat dissipation plate 50. The cover circumferential portion 22 may protrude forwardly from the circumference of the cover body 21 to surround the outer circumference of the display panel 10 and the heat dissipation plate 50. The heat dissipation plate 50 may be adhered to the back surface of the display panel 10 by the adhesive member 60 to dissipate heat generated in the display panel 10.

The adhesive member 60 can adhere to the front surface of the heat dissipation plate 50 and the back surface of the display panel 10 to each other. That is, the adhesive member 60 can be located between the heat dissipation plate 50 and the display panel 10 in the forward-and-backward direction.

Similar to the above-described embodiment, the adhesive member 60 can include the first adhesive member 70 (see FIG. 4) and the second adhesive member 80 (see FIG. 4) for adhering different areas of the display panel 10 and the heat dissipation plate 50. The first adhesive member 70 can be adhered to the edge of the front surface of the heat dissipation plate 50, and the second adhesive member 80 can be located inner than the first adhesive member 70 on the front surface of the heat dissipation plate 50.

In this instance, the first cover adhesive layer 73 of the first adhesive member 70 may be referred to as a first plate adhesive layer and the second cover adhesive layer 83 of the second adhesive member 80 may be referred to as a second plate adhesive layer.

According to the preferred embodiment of the present invention, since the adhesive strength of the second panel adhesive layer including the urethane adhesive is relatively low, it is possible to easily peel the second panel adhesive layer off from the display panel by pulling the display panel by the suction mechanism. Therefore, it is possible to easily separate the display panel and the module cover.

In addition, since the adhesive strength of the second panel adhesive layer including the urethane adhesive is maintained even after separation of the display panel, the second panel adhesive layer can be reused and a new display panel may be adhered to the already used second panel adhesive layer. Therefore, it is possible to reduce the service cost generated by the second adhesive member including the second panel adhesive layer.

In addition, it is possible to prevent a coupling force between the display panel and the module cover from being reduced, by adhering the display panel and the module cover using not only the second adhesive member including the second panel adhesive layer, but also the first adhesive member having a relatively high adhesive strength. Since the first adhesive member is located on the edge of the module cover, the operator can easily cut the first adhesive member.

Further, the second adhesive member may include a second cover adhesive layer adhered to the module cover and a second panel adhesive layer adhered to the display panel. In this case, since the adhesive strength of the second cover adhesive layer including the acrylic adhesive is stronger than that of the second panel adhesive layer including the urethane adhesive, the second adhesive member may be peeled off from the display panel and may not be peeled off from the module cover. Therefore, it is unnecessary to re-adhere the second adhesive member to the module cover when the second adhesive member is reused.

The foregoing description is merely illustrative of the technical idea of the present invention, and various changes and modifications may be made by those skilled in the art without departing from the essential characteristics of the present invention. Therefore, the embodiments disclosed in the present invention are to be construed as illustrative and not restrictive, and the scope of the technical idea of the present invention is not limited by these embodiments. The scope of the present invention should be construed according to the following claims, and all technical ideas within equivalency range of the appended claims should be construed as being included in the scope of the present invention.

What is claimed is:

1. A display device comprising:
a display panel;
a module cover configured to cover a back surface of the display panel;
a first adhesive member adhered to an edge of a front surface of the module cover facing the display panel and configured to adhere the module cover and the display panel; and
a second adhesive member adhered to an inner area of the module cover inside the edge of the front surface and configured to adhere the module cover and the display panel,
wherein the first adhesive member includes:
a first base layer; and
a pair of acrylic adhesive layers located at opposite sides of the first base layer and respectively adhered to the display panel and the module cover, and
wherein the second adhesive member includes:
a second base layer;
a urethane adhesive layer located at one side of the second base layer and adhered to the display panel; and
an acrylic adhesive layer located at another side of the second base layer, adhered to the module cover and having a greater adhesive strength than the urethane adhesive layer.

2. The display device of claim 1, wherein the first adhesive member further includes a first film between the first base layer and a first acrylic adhesive layer of the pair of acrylic adhesive layers adhered to the display panel, and includes a second film between the first base layer and a second acrylic adhesive layer of the pair of acrylic adhesive layers adhered to the module cover.

3. The display device of claim 2, wherein a first interfacial adhesive strength between the first film and the first acrylic adhesive layer is greater than a second interfacial adhesive strength between the first acrylic adhesive layer and the display panel.

4. The display device of claim 3, wherein a third interfacial adhesive strength between the second film and the second acrylic adhesive layer is greater than a fourth interfacial adhesive strength between the second acrylic adhesive layer and the module cover.

5. The display device of claim 2, wherein a thickness of the first base layer is greater than that of each of the first acrylic adhesive layer, the second acrylic adhesive layer, the first film and the second film.

6. The display device of claim 2, wherein the first film and the second film have different coefficients of extension.

7. The display device of claim 2, wherein any one of the first film and the second film includes thermoplastic poly urethane (TPU) and another of the first film and the second film includes polyethyleneterephthalate (PET).

8. The display device of claim 2, wherein at least one of the first film or the second film has a black layer laminated thereon.

9. The display device of claim 2, wherein the first base layer includes polyurethane foam.

10. The display device of claim 2, wherein the first adhesive member further includes an auxiliary adhesive layer between the first film and the first base layer to attach the first film to the first base layer.

11. The display device of claim 1, wherein a thickness of the second base layer is greater than a thickness of the first base layer.

12. The display device of claim 1, wherein the second base layer includes acrylic foam.

13. The display device of claim 1, wherein an adhesive strength of the urethane adhesive layer adhered to the display panel is less than that of the acrylic adhesive layer adhered to the module cover.

14. The display device of claim 13, wherein the adhesive strength of the urethane adhesive layer is less than that of the acrylic adhesive layer.

15. The display device of claim 1, wherein the second adhesive member further includes a film located between the second base layer and the urethane adhesive layer.

16. The display device of claim 15, wherein a thickness of the second base layer is greater than that of each of the urethane adhesive layer, the acrylic adhesive layer and the film.

17. The display device of claim 1, wherein the module cover includes:
   a cover body located behind the display panel and having the first adhesive member and the second adhesive member adhered thereto; and
   a cover circumferential portion protruding forwardly from a circumference of the cover body to surround an outer circumference of the display panel.

18. The display device of claim 1, wherein the module cover includes:
   a heat dissipation plate located behind the display panel and having the first adhesive member and the second adhesive member adhered thereto;
   a cover body located behind the heat dissipation plate; and
   a cover circumferential portion protruding forwardly from a circumference of the cover body to surround an outer circumference of the display panel and the heat dissipation plate.

19. A display device comprising:
   a display panel;
   a module cover configured to cover a back surface of the display panel;
   an acrylic adhesive member adhered to an edge of a front surface of the module cover facing the display panel and configured to adhere the module cover and the display panel; and
   a urethane adhesive member adhered to an inner area of the module cover inside the edge of the front surface and configured to adhere the module cover and the display panel,
   wherein an adhesive strength of the urethane adhesive layer is less than that of the acrylic adhesive layer.

20. The display device of claim 19, wherein the acrylic adhesive member includes a foam based layer configured to be cut when a suction mechanism pulls the display panel from the module cover to create a gap between the display panel and the module cover.

* * * * *